United States Patent
Gies

(10) Patent No.: US 12,351,220 B2
(45) Date of Patent: *Jul. 8, 2025

(54) BROKEN RAIL DETECTOR

(71) Applicant: Athena Industrial Technologies Inc., Calgary (CA)

(72) Inventor: Paul D. Gies, Calgary (CA)

(73) Assignee: Athena Industrial Technologies Inc., Calgary (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/611,165

(22) Filed: Mar. 20, 2024

(65) Prior Publication Data

US 2024/0278815 A1 Aug. 22, 2024

Related U.S. Application Data

(63) Continuation of application No. 17/070,693, filed on Oct. 14, 2020, now Pat. No. 11,975,750.

(Continued)

(51) Int. Cl.
*B61L 23/04* (2006.01)
*B61L 1/16* (2006.01)
(Continued)

(52) U.S. Cl.
CPC ............. *B61L 23/044* (2013.01); *B61L 1/163* (2013.01); *B61L 1/165* (2013.01); *B61L 1/18* (2013.01);
(Continued)

(58) Field of Classification Search
CPC ...... B61L 23/044; B61L 23/042; B61L 1/187; B61L 1/18; B61L 1/165; B61L 1/163; G01R 19/04; G01R 19/10; G01R 25/005
(Continued)

(56) References Cited

U.S. PATENT DOCUMENTS 3,683,176 A 8/1972 Crofts
3,970,271 A 7/1976 Auer et al.
(Continued)

FOREIGN PATENT DOCUMENTS

CN 106167034 A 11/2016
CN 104936849 B 9/2017
(Continued)

OTHER PUBLICATIONS

Bowden, Richard P, "Broken Rail Detection in Non-Signaled Territory", BNSF Railway Company, 2010.
(Continued)

*Primary Examiner* — S. Joseph Morano
*Assistant Examiner* — James William Jones
(74) *Attorney, Agent, or Firm* — Justin R. Jackson; Deborah A. Peacock; Peacock Law P.C.

(57) ABSTRACT

A method and apparatus to detect breaks in tracks and/or detect the presence of a vehicle, such as a train, in a monitored section of the track or rail. Embodiments of the present invention measure the change in track inductance associated with a track or rail break. Electrical shunts are connected between the rails at spaced-apart intervals (for example a shunt can be placed every mile). At least two different frequencies of alternating current are generated and fed into the segments of rail (for example at or near a mid-point between the shunts). If a rail break occurs, the total inductance of the rail at that segment will change. Using two or more frequencies allows a rail break to be differentiated from environmental rail-to-rail and rail-to-earth leakage.

24 Claims, 3 Drawing Sheets

Related U.S. Application Data

(60) Provisional application No. 62/914,751, filed on Oct. 14, 2019.

(51) Int. Cl.
| | | |
|---|---|---|
| *B61L 1/18* | (2006.01) | |
| *G01R 19/04* | (2006.01) | |
| *G01R 25/00* | (2006.01) | |
| *G01R 19/10* | (2006.01) | |

(52) U.S. Cl.
CPC .............. *B61L 1/187* (2013.01); *B61L 23/042* (2013.01); *G01R 19/04* (2013.01); *G01R 25/005* (2013.01); *G01R 19/10* (2013.01)

(58) Field of Classification Search
USPC .......................................................... 246/121
See application file for complete search history.

(56) References Cited

U.S. PATENT DOCUMENTS

| | | |
|---|---|---|
| 4,306,694 A | 12/1981 | Kuhn |
| 4,352,475 A | 10/1982 | Smith et al. |
| 4,442,988 A | 4/1984 | Laurent et al. |
| 4,932,614 A | 6/1990 | Birkin |
| 5,680,054 A | 10/1997 | Gauthier |
| 6,102,340 A | 8/2000 | Peek et al. |
| 6,216,985 B1 | 4/2001 | Stephens |
| 6,271,754 B1 | 8/2001 | Durtler |
| 6,459,656 B1 | 10/2002 | Futsuhara et al. |
| 6,655,639 B2 | 12/2003 | Grappone |
| 6,830,224 B2 | 12/2004 | Lewin et al. |
| 8,157,219 B2 | 4/2012 | Ashraf et al. |
| 8,985,523 B2 | 3/2015 | Chadwick et al. |
| 8,996,208 B2 | 3/2015 | Shoppa et al. |
| 9,102,341 B2 | 8/2015 | Malone et al. |
| 9,150,228 B2 | 10/2015 | Grappone |
| 9,162,691 B2 | 10/2015 | Polivka et al. |
| 9,669,851 B2 | 6/2017 | Cooper et al. |
| 9,802,631 B2 | 10/2017 | Matthews et al. |
| 9,834,237 B2 | 12/2017 | Plotnikov et al. |
| 10,167,005 B2 | 1/2019 | Noffsinger et al. |
| 10,351,150 B1 * | 7/2019 | Lederman ............. B61L 23/042 |
| 10,689,016 B2 | 6/2020 | Woo et al. |
| 10,822,003 B2 | 11/2020 | Aisa |
| 11,975,750 B2 * | 5/2024 | Gies ......................... B61L 1/18 |
| 2003/0038216 A1 | 2/2003 | Holgate |
| 2006/0202860 A1 | 9/2006 | Tsai et al. |
| 2006/0205369 A1 | 9/2006 | Schaich et al. |
| 2007/0132463 A1 | 6/2007 | Anderson |
| 2010/0025545 A1 | 2/2010 | Koval |
| 2010/0235123 A1 | 9/2010 | Bartonek |
| 2010/0283437 A1 * | 11/2010 | Chung .................... H02M 1/44 323/212 |
| 2013/0284859 A1 | 10/2013 | Polivka et al. |
| 2014/0044146 A1 | 2/2014 | Harrison |
| 2015/0307117 A1 | 10/2015 | Noffsinger et al. |
| 2015/0367872 A1 | 12/2015 | Plotnikov et al. |
| 2016/0244078 A1 | 8/2016 | Noffsinger et al. |
| 2018/0065650 A1 * | 3/2018 | Plotnikov ................ B61L 3/08 |
| 2019/0061794 A1 | 2/2019 | Noffsinger et al. |
| 2019/0193762 A1 | 6/2019 | Machado et al. |
| 2019/0344814 A1 | 11/2019 | Plotnikov et al. |
| 2019/0370638 A1 * | 12/2019 | Green ...................... G06N 3/08 |
| 2021/0107541 A1 | 4/2021 | Gies |
| 2022/0234632 A1 | 7/2022 | Gies |

FOREIGN PATENT DOCUMENTS

| | | |
|---|---|---|
| DE | 2121971 A1 | 11/1971 |
| DE | 2623967 A1 | 12/1977 |
| EP | 1603785 B1 | 5/2008 |
| EP | 2090491 A1 | 8/2009 |
| FR | 2303900 A1 | 10/1976 |
| GB | 2311190 A | 9/1997 |
| WO | 2016182994 A1 | 11/2016 |

OTHER PUBLICATIONS

Burger, Francois A, "A Practical Continuous Operating Rail Break Detection System Using Guided Waves", Institute for Maritime Technology, 18th World Conference on Non-destructive Testing, Durban, South Africa, Apr. 20, 2012.

Kindt, Joel, et al., "Next Generation Track Circuits", U.S. Department of Transportation Report No. FRA/ORD-18/10, Apr. 2018.

Turner, Steven, "Feasibility of Locomotive-Mounted Broken Rail Detection", Final Report for High-Speed Rail Innovations Deserving Exploratory Analysis Programs (IDEA) Project 38, Jun. 21, 2004.

Whalen, R. B, et al., "Lightweight Vehicle Track Shunting", U.S. Department of Transportation Report No. FRA/ORD-81/56, Apr. 1981.

* cited by examiner

BROKEN RAIL DETECTOR

CROSS-REFERENCE TO RELATED APPLICATIONS

This application is a continuation of U.S. patent application Ser. No. 17/070,693, entitled "Broken Rail Detector", filed on Oct. 14, 2020, which itself claims priority to and the benefit of the filing of U.S. Provisional Patent Application No. 62/914,751, entitled "Broken Rail Detector", filed on Oct. 14, 2019, and the specifications and claims, if any, thereof are incorporated herein by reference.

BACKGROUND OF THE INVENTION

Embodiments of the present invention relate to a method and apparatus to detect breaks in a track, such as a rail line, and the ability to detect the presence of a train or rail car or other rail vehicles with conductive axles in a monitored section of track.

Existing technologies for detecting breaks in railroad tracks usually require significant modifications to the rail or the addition of various types of sensors, which can include wires and/or fiber optics. Such known systems suffer from high installation costs, often require complicated maintenance procedures which necessitate specialized personnel and equipment. Such known systems can result in detection reliability errors caused by the severe conditions that most railroad tracks experience. Existing technology for detecting the presence of trains in a section of rail usually involve the wheels and axles completing a circuit in an isolated section of rail, proximity detection of the metal in the train, or detection of identification transponders mounted to locomotives and/or rail cars. Rail isolation can be achieved by using shunts of different types and in some cases insulated joints. Insulated joints associated with rail crossings are common in urban areas.

There is thus a present need for a method and apparatus that involves only minor cost, minor modifications to the installation of new or existing rails, no additional infrastructure installation, and no specialized installation and maintenance personnel. There is further a present need for a method and apparatus which has significantly lower susceptibility to environmental effects on a rail track than do existing technologies.

BRIEF SUMMARY OF EMBODIMENTS OF THE PRESENT INVENTION

Embodiments of the present invention relate to a detector that includes a circuit configured to inject at least two frequencies of alternating electrical current into a shunted segment of a track, and the circuit configured to measure an amplitude difference and a phase angle between the at least two frequencies of alternating current and identify a break in at least a portion of the track based on a change in the measured amplitude difference and phase angle. The track can include a rail track. The shunted segment of the track can include an electrical shunt disposed at opposing ends of the shunted segment of the track. Optionally, the electrical shunt can include an electrical conductor that is electrically connected between two rails of the shunted segment of the track. The circuit can be electrically connected at or about a midpoint of the shunted segment of the track.

In one embodiment, the circuit can be configured to monitor current flow to the shunted segment of the track, and/or configured to measure an amplitude of the at least two frequencies of alternating electrical current to cancel out common parasitic resistance of the shunted segment of the track. The detector can also include a communications unit. The communications unit can be configured to provide data telemetry. Optionally, the communications unit can include a radio frequency transmitter. The detector can be configured to transmit data and to relay data received from another detector. Optionally, the detector can also include a communication node configured to receive data from the detector and the communication node can be configured to transmit the data. In one embodiment, the circuit does not determine a break in the track merely by identifying a drop in current flow through all or a portion of the shunted track segment.

Embodiments of the present invention also relate to a method for detecting a break in at least a portion of a track, the method including forming a track segment by establishing an electrical shunt at each end of the track segment, injecting at least two frequencies of alternating electrical current into the track segment, monitoring a phase angle between the at least two frequencies of alternating current, and transmitting data indicative of a break in the track. Establishing an electrical shunt at each end of the track can include selecting a portion of track which is bounded by at least one existing electrical shunt. The track can include a rail track.

In one embodiment, indicia of a break is generated in response to an observed positive amplitude shift from a baseline reference point for a lower of the two frequencies of alternating current in addition to a negative phase shift being observed in a higher of the two frequencies of alternating current. In one embodiment, the method does not merely determine a break in the track segment based on reduced current flow through all or a portion of the track segment. Optionally, transmitting data indicative of a break can include transmitting an alert of a break and/or transmitting data of or relating to the phase angle between the at least two frequencies such that a determination of a break can be determined. Transmitting data indicative of a break can include transmitting data via a radio frequency of less than about 200 kilohertz. The method can also include monitoring a voltage of the at least two frequencies of alternating electrical current and using data from the monitored voltage to cancel out common parasitic resistance of the shunted segment of the track.

The method can also include relaying data received from an apparatus that is configured to monitor a different track segment. The method can also include providing a communication node that is configured to receive data from a plurality of monitoring devices, and/or transmitting data indicative of a presence of a vehicle on the track segment. The vehicle can be a train or portion thereof and the track can be a rail track.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more embodiments of the invention and are not to be construed as limiting the invention. In the drawings.

DETAILED DESCRIPTION OF THE INVENTION

Figure 1A:
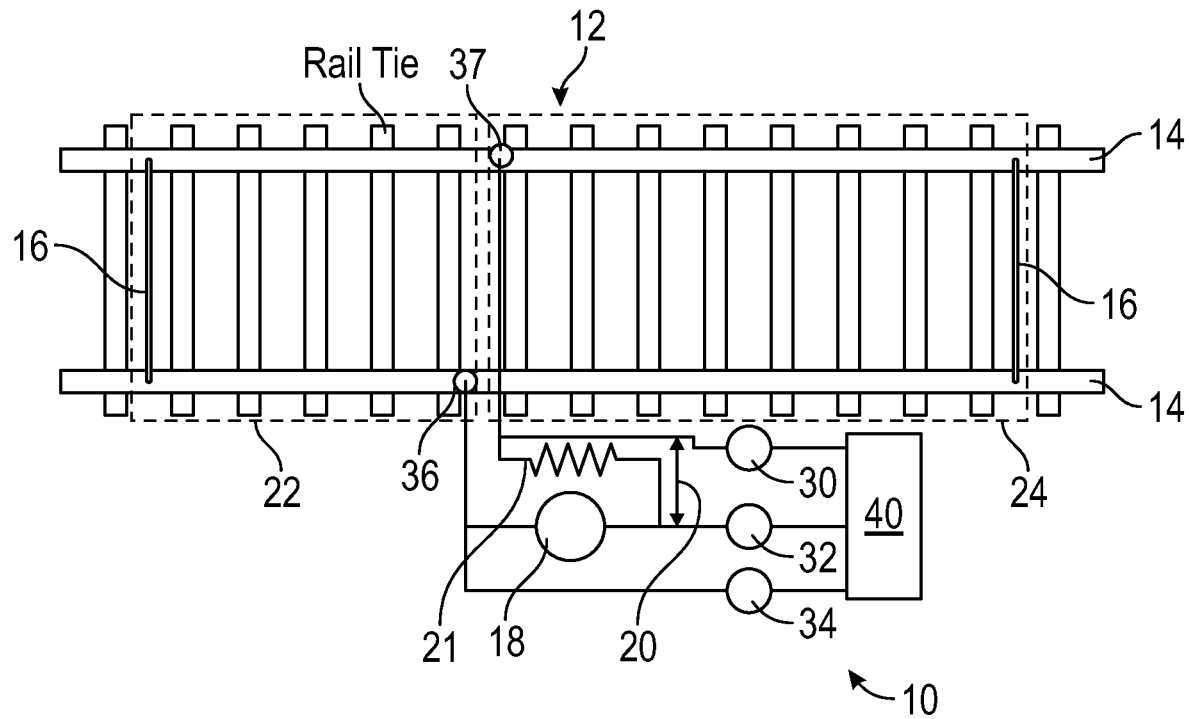
FIG. 1A is a drawing which schematically illustrates a broken rail detector according to an embodiment of the present invention.

Embodiments of the present invention detect breaks in a track, such as a rail track, and detects the presence of a train, train car or other rail vehicle on a portion of the track, by treating a portion of the track as a long conductor. As such it has two dominant properties, resistance and inductance. Reliance on a change in resistance, caused by a break in the rail (conductor) is commonly used in existing technologies. This property is subject to the effects of rail contamination that allows current to leak into the earth, through dirt and moisture, and bypass the break. Special procedures are required to mitigate this problem.

Referring now to the figures, detector 10 preferably takes advantage of the inductive properties of rail tracks 12 and cancels out the environmental effects. To achieve this, rail tracks 12, which are preferably formed from a plurality of individual rails 14 arranged in parallel and disposed a distance from one another, are preferably electrically shunted together via track-to-track shunts 16. Shunts 16 preferably include, for example, a wire connected between a pair of rails 14. Although shunts can comprise almost any desired size or diameter, in one embodiment, shunts 16 most preferably comprise about 20 gauge to about 8 gauge wire and more preferably about 16 gauge to 12 gauge wire and most preferably about 14 gauge wire. Although the connection of shunts 16 can be made at any desirable location or configuration, in one embodiment, shunts 16 are most preferably permanently bonded to the web or foot of the rail. Shunts 16 are most preferably formed from a stranded steel cable, but can be formed from other materials and structures, and can optionally include existing connections—for example, shunted connections associated with existing infrastructure, which can include for example portions of warning circuits associated with active crossing warning systems. Most preferably, a plurality of shunts 16 are disposed along rail tracks 12 at a predetermined distance interval (See FIG. 1A). The predetermined distance interval can optionally be made large—for example greater than 100 feet, more preferably greater than 1,000 feet, and most preferably about one mile or more. At some point between a pair of shunts 16, which can include for example near a mid-point of the distance between a pair of shunts 16, a connection is made to each rail 14 and a signal generator 18, which is preferably equipped with or otherwise coupled to a current sensor 20, which can include for example, a voltage measurement taken across a known resistance, which itself can include a measurement across resistor 21. Although in one embodiment, connection is most preferably made at or near a mid-point of a segment of rail tracks 12, in one embodiment, the apparatus and method can provide desirable results when connection is made anywhere from about ¼ to about ¾ of the length of a rail segment.

Figure 2:
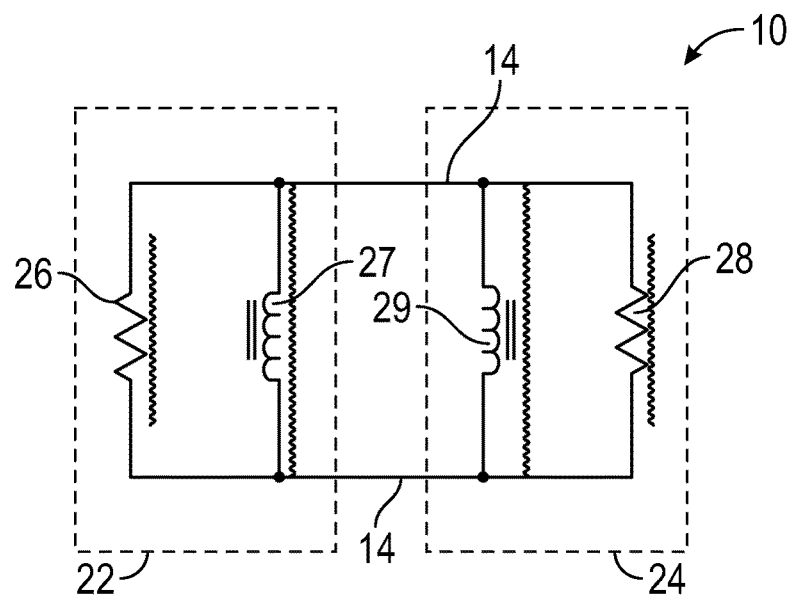
FIG. 2 is a drawing which schematically illustrates an electrical equivalent of a shunted portion of railroad tracks.

FIG. 2 illustrates an electrical equivalent circuit of the configuration formed by detector 10. As can be seen, electrically, the shunted portion of rails 14 behave as parallel inductors, first loop 22, and second loop 24, when signal generator 18 and current sensor 20 (see FIG. 1A) are connected thereto, thus providing unknown parasitic resistance 26 in first loop 22, which is in parallel with rail inductance 27, and in second loop 24, unknown parasitic resistance 28 which is in parallel with rail inductance 29. Parasitic resistances 26 and 28 are caused by environmental contamination of the rails, usually from combinations of dirt, rain, snow, standing water, etc. Environmental effects also occur from heating and cooling cycles during the day as well as resistivity changes at bolted joints. Signal generator 18 preferably applies an electrical signal to rails 14. Most preferably the signal applied is a relatively low frequency—for example, less than 100K Hertz ("Hz") and most preferably less than 10K Hz. Optionally, the frequency can be less than 1K Hz and/or less than 100 Hz.

The signal detected at point 30 of FIG. 1A is preferably measured for both amplitude and phase relative to the signal measured at point 32. The signal detected and/or measured at points 30 and 32 are preferably made with respect to common point 34. Optionally, a section of track can be divided into segments and each segment can be monitored via an embodiment of the present invention and a circuit for monitoring each segment is occasionally referred to herein as a "node" such that a length of track is monitored by a plurality of nodes. Signal injection and detection points 36 and 37 together serve as a monitoring point for a segment or section of rail tracks 12. Thus, if a span of 100 miles of rail tracks were divided into 100 segments that were each one mile long, and if each segment had detection points 36 and 37, there would thus be formed 100 nodes for that 100 miles of rail tracks. If a break occurs in either, or both, of first loop 22 and/or second loop 24, the inductance presented at detection points 36 and 37 will change and there will be a resulting change in both the amplitude and phase of the signal detected at point 30. This amplitude will also be affected by the amount of parasitic resistance that is present. It cannot be assumed that the parasitic resistance is constant or in any way predictable. By applying two different frequencies (for example 100 Hz and 500 Hz) to the rail loops, the common parasitic resistance can be cancelled out by measuring the ratio of the amplitudes of the two frequencies detected at point 30. This assumes that the amplitude of both frequencies at point 32 is the same. If not, the signals measured at point 30 are preferably normalized accordingly. Further, the measured phase angle for each frequency can be used to detect the presence of a break. This can be done with a single frequency or multiple frequencies. With a single frequency, unknown parasitic factors can cause errors in the defect detection. Crossing control systems that use a method that operates on a single frequency, instead of a plurality of different frequencies as is preferably used in embodiments of the present invention, must operate at fairly high power levels (10's of watts), and over comparatively short lengths of several hundred feet; whereas embodiments of the present invention were tested and found to provide desirable results using only about 1 watt of power to perform a test sequence on a 1-mile section of rail.

The ratio of the phase angles between the two frequencies can be used to further improve accuracy of the break detection. A simplified example of this process is illustrated in the measured test data of Tables 1 and 2 as further discussed in the Example 1 below.

As can clearly be seen in the example data of Tables 1 and 2, there is a change in inductance associated with a rail break condition. Conversely, the presence of a train in the monitored section of rail tracks 12 causes a corresponding reduction in the measured inductance value as the train wheels and axles create shorter conductor loops by shunting the rails at positions closer to the detection point.

The rail shunts also act to isolate track sections. Using the measurement methodology described above, rail break and train presence events that occur before the left shunt or after the right shunt are not detected. This allows a detection event to be positively associated with a section of rail monitored by a given node. If the measurement point is not centered in the monitored rail section it is possible to determine which side of the node the detection event occurred on.

During a normal test sequence, only a small number of cycles (for example, about 10 or less) of each frequency are required to complete a detection test. This enables testing to be performed very rapidly, thus resulting in nearly instantaneous testing of an entire section of rail tracks 12.

Data communication module 40 is preferably communicably coupled to detection points 30, 32, and 34 and can thus communicate to a hub or other location, measured results and other data (for example a status indicator, which can include for example the detection of an improperly functioning circuit and/or a low or loss of power indicator).

In one embodiment, data communication module 40 can include a node box which has space to mount a variety of data telemetry technologies. As such, each data communication module 40 can accommodate any of various data telemetry systems. Such various data telemetry systems can include not only low frequency RF communications, but can optionally include, in rail data transmission, conventional radio-based modems, cellular systems, satellite, fiber optic, internet-based, conventional telephone lines, combinations thereof and the like, as well as any other known data transmission protocols and/or systems. For example, rail tracks which pass from a vast open area through a city and back through an expanse of open area can optionally include low frequency RF data transmission in the open areas but can include cellular and Internet data transmission along portions of the rail tracks that pass through a city. Thus, a single length of rail tracks can be monitored and the data generated thereby can be transmitted by a combination of different communication systems and/or protocols. This flexibility allows the telemetry hardware to be tailored to various environments.

Optionally, a daisy chain communication system can be used. Also optionally, each data communication module 40 can have a unique identification (i.e. a "node ID"), and/or a mile marker indicia. Each communication node 50 can optionally have a table of the unique identifications of the various data communication modules and also preferably of their corresponding mile marker indicia, in a monitored subdivision.

Data can be transmitted as messages and can optionally include an identification sequence number in addition to the node ID and mile marker indicia for the node that sourced the message. Each message also preferably contains the node ID and mile marker indicia of the node that relayed the message. These values can be the same as the source node for the first relay. When a node broadcasts a message (i.e. when data communication module 40 broadcasts a message), it can be detected by the data communication module of one or more adjacent nodes.

The telemetry logic is preferably configured so that a message from a data communication module can be transmitted sequentially (for example node-by-node in each direction), thus resulting in ascending and descending node and mile marker indicia. Optionally, confirmation of a received message can be sent back to the previous node before being passed on to the next node. This methodology allows corrupted or lost transmissions to be retried. Still further, sending the data in both directions allows the message to reach at least one communication node 50, and likely two. Optionally there can be more than one communication node 50 in any given sub-division of rail tracks. In one embodiment, one or more, or even all data communication modules 40 can optionally be configured to communicate directly with one or more communication nodes 50, without requiring the data to be relayed through other data communication modules. This can be particularly advantageous in urban areas with a significant amount of existing communication infrastructure.

When a broken rail or train presence event is detected, it is preferably communicated to a data hub or a central location so that the appropriate action can be taken. The railroad environment is highly varied and does not generally allow for the consistent application of radio or other communication methods without a considerable investment in supporting infrastructure. Controlled crossings and urban rail sections often already have this infrastructure in place. Rail lines in rural or remote areas may only have communication capabilities at controlled crossings or at specific sections of instrumented track. Un-monitored rail sections are referred to as dark territory.

Embodiments of detector 10 preferably do not require the construction of additional communication infrastructure to each detector for each segment of rail tracks 12. Instead, low frequency radio waves are preferably used to communicate between detectors. Optionally, a rail can be used as a conductor for long wavelength electromagnetic signals or as an antenna when an insulated rail joint is encountered—for example, as are used for some types of controlled crossings.

Low frequency radio communication is rarely used now due to its very low data rate capabilities and the typically very long antennas that are needed, which can exceed 1000 feet in length. Using the rail itself as an antenna or signal conductor solves this problem. Remote car starters and key 'fobs' commonly use this frequency band but do not operate at the power levels required to interfere with the signals used in data communication module 40.

Figure 1B:
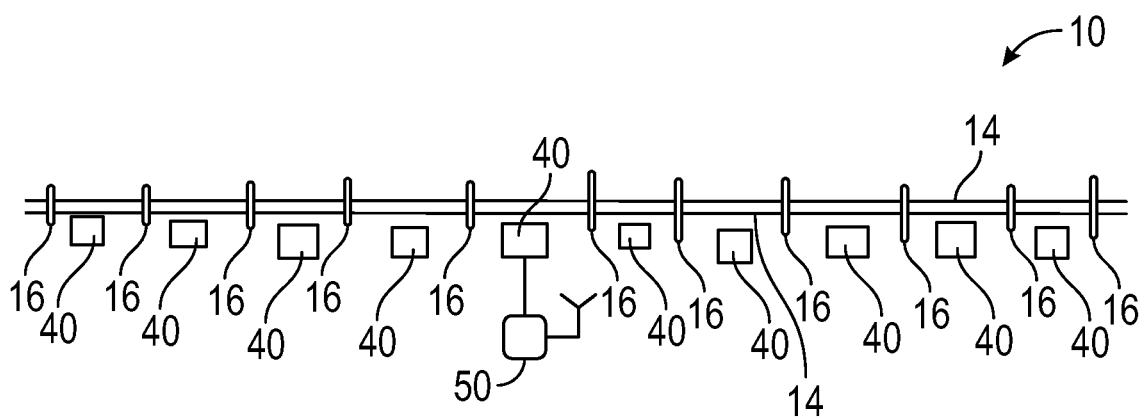
FIG. 1B is a drawing which illustrates a length of rail tracks that are monitored by a plurality of nodes and which communicate information to a communication node according to an embodiment of the present invention.

Optionally, a length of rail tracks 12 can be divided into a plurality of monitored segments which are each monitored by a separate detector 10. Optionally, detectors 10 can be placed at intervals of approximately 1 mile along a section of rail tracks 12 to be monitored. Each detector 10 is preferably independently powered and operates independently of other detectors for other segments of rail tracks 12. It is possible that more than 100 detectors can form a group monitoring a section of rail tracks 12. A monitored section of rail tracks 12 is occasionally referred to herein as a "sub-division". Over the course of several monitored segments (for example over the course of 100 miles), there can be a point where a preexisting data communication point exists (for example a 'Hot-Box', which can be provided for example at a monitored crossing). At this point, communication node 50, (see FIG. 1B) which can optionally include a detector 10 (which if provided can also monitor a segment of rail tracks 12), can be placed. Regardless of whether a communication node 50 is connected to an accompanying detector for that particular segment of rail tracks 12, communication node 50 preferably communicates with the other detectors 10 by passing data from detector 10 to detector 10 (or at least the data communication module 40 thereof) along the monitored section of rail tracks 12. As such, data communication module 40 can be configured to relay communications received from other detectors 10, such that data from one detector is relayed through the communication module 40 of other detectors 10 until the data finally reaches communication node 50 where it can be transmitted (for example where it can be transmitted via previously installed communications infrastructure). This methodology is generally much less susceptible to environmental effects such as line-of-sight, snow cover, foliage effects, and interference of other common radio technologies.

The data communication method used by embodiments of the present invention requires very low power at each detector 10 and allows each detector to optionally be powered by a battery with a small solar panel for recharging. Very low power consumption is required for areas where there are extended periods of low light levels (for example northern areas) or when detectors 10 are covered by snow.

With respect to the inter-node data communications system that is preferably implemented via data communication module 40, terrain problems can include line-of-sight obstructions, foliage absorption and snow cover, which can limit the use of very high frequency and microwave bands of radio telemetry. A low frequency radio band can be used and will provide desirable results. Most preferably, data communication module 40 transmits, receives, and/or relays data at a about 10 Khz to 500 Khz and more preferably at about 50 kHz to about 200 kHz frequency range. Telemetry power consumption is most preferably less than about 0.2 watts and more preferably less than about 0.08 watts in the receive mode. In one embodiment, communication module 40 can transmit and/or relay data at a rate of about 100 to about 2,000 bits per second and more preferably at a rate of about 500 bits per second.

In one embodiment, a rail break is determined when a positive amplitude shift from a baseline reference point is observed in a lower test frequency while a negative phase shift is observed in a higher test frequency. In one embodiment, a train presence is determined when a negative amplitude shift is observed in addition to a positive phase shift for all frequencies. In one embodiment, the baseline reference level is preferably compensated for environmental effects by normalizing the amplitude values relative to the phase values when no trains are present and when no break defects are present.

An embodiment of the present invention uses signals for rail break detection, train presence detection and data communication that are at frequencies and power levels that are highly unlikely to affect existing signaling and other infrastructures that are normally present on an operating track. Embodiments of the present invention preferably do not depend on direct current ("DC") or alternating current ("AC") current methods that detect rail breaks by loss of current flow as such methods are subject to false results created by environmental rail-to-rail and rail-to-earth leakage.

INDUSTRIAL APPLICABILITY

The invention is further illustrated by the following non-limiting examples.

Example 1

Figure 3A:
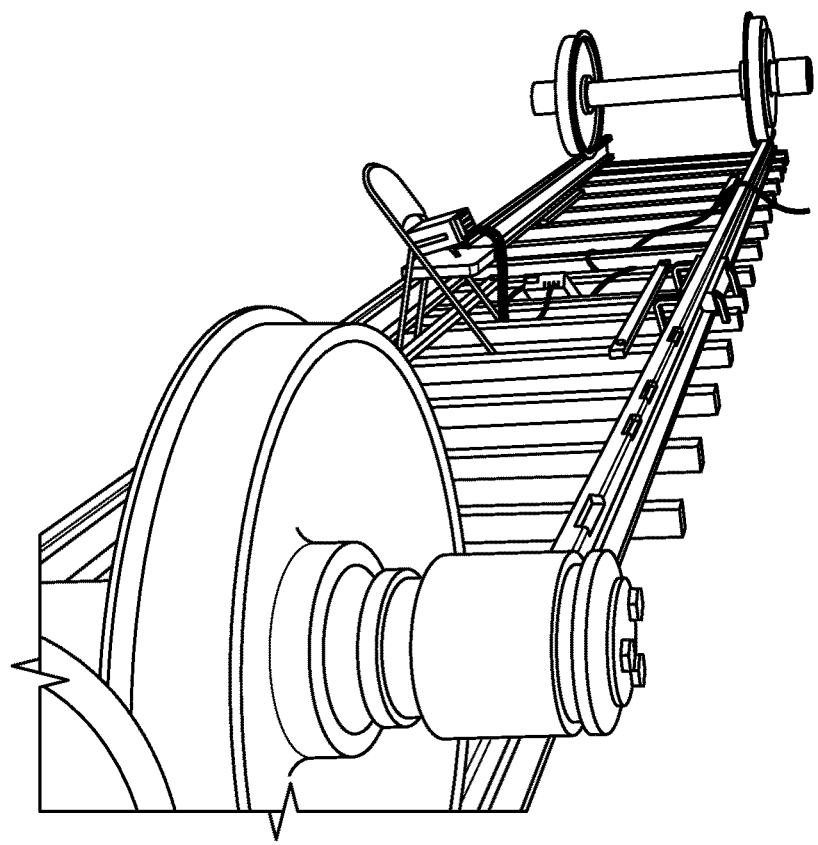
FIG. 3A is a drawing which illustrates a test setup wherein an embodiment of the present invention was constructed and tested in a lab.
Figure 3B:
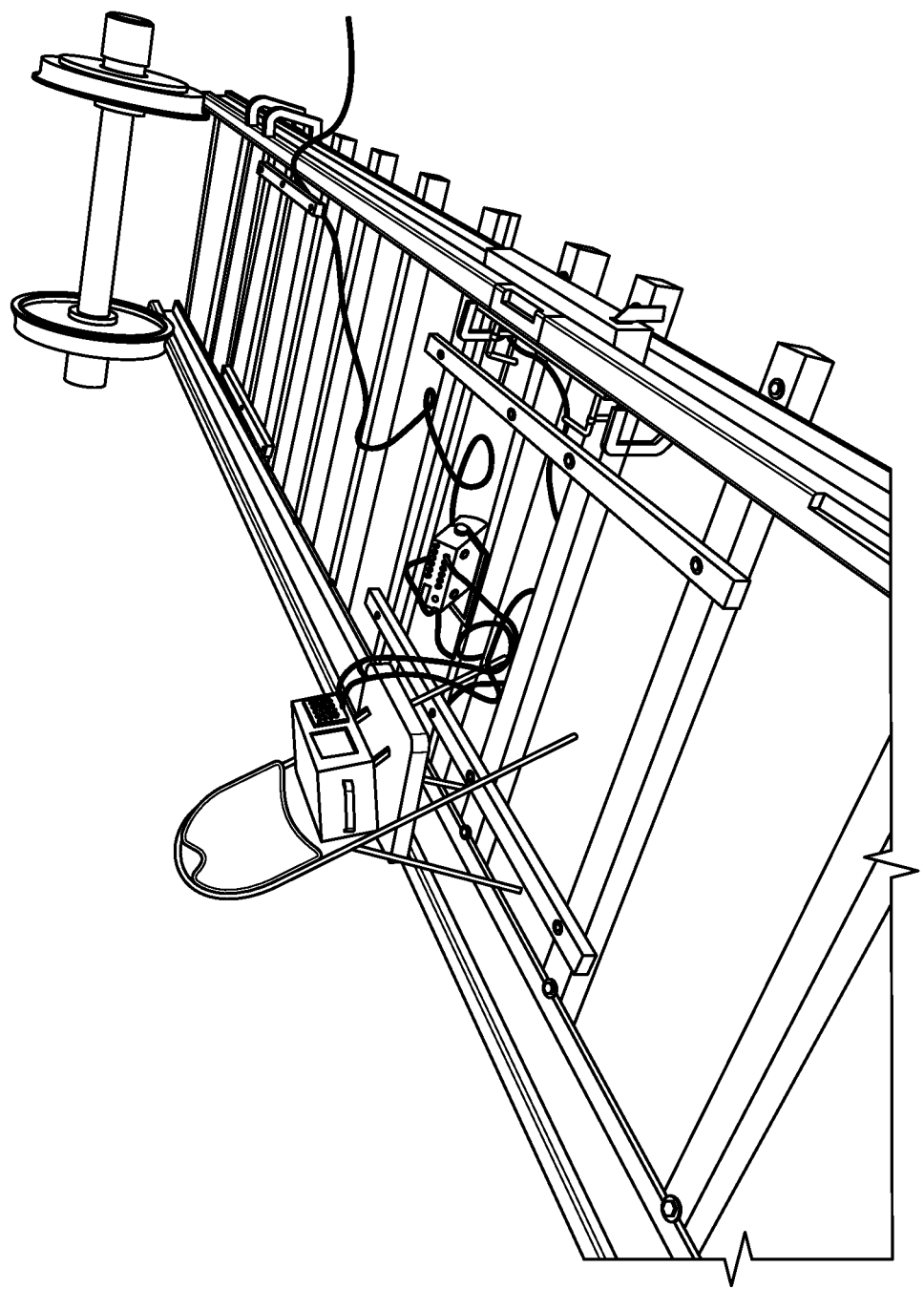
FIG. 3B is a drawing which illustrates the area of the test setup wherein the electrical connection was made on one of the rails for the connection of the electrical components.

A portion of a test rail track was constructed along with an apparatus according to an embodiment of the present invention (see FIGS. 3A and 3B).

This first test was setup to test a broken rail detector using a 40-foot test rail in a test laboratory, in order to evaluate parallel inductive loops that are formed in the test rail. The equipment used in the test included, the test rail, a frequency generator, an oscilloscope, an inductance meter, a digital voltmeter, and a current sense resistor. A schematic of the test setup is illustrated in FIG. 1A. For the test, resistor 21 was used and had a value of 60 ohms. Point 32 was connected to channel A of the oscilloscope. Point 30 was connected to channel B of the oscilloscope. The signal generator was used without additional amplification.

Table 1 summarizes measurements taken when no break was provided in the rails.

TABLE 1

| Frequency (kHz) | Gen. Amplitude (V p-p) | Rail Amplitude (V p-p) | Phase Delay (μS) |
| --- | --- | --- | --- |
| 150.00 | 2.0 | 0.28 | −0.95 |
| 49.69 | 2.0 | 0.13 | −3.0 |

Table 2 summarizes measurements taken when a break was provided in one of the rails.

TABLE 2

| Frequency (kHz) | Gen. Amplitude (V p-p) | Rail Amplitude (V p-p) | Phase Delay (μS) |
| --- | --- | --- | --- |
| 150.38 | 2.0 | 0.48 | −0.75 |
| 49.69 | 2.0 | 0.31 | −2.0 |

Given the greater than 400:1 ratio between the rail loop resistance and the signal injection series resistor, less than 0.005V of the rail amplitude value can be attributed to changes in the DC resistance of the test track when it was broken. As previously noted, the DC resistance was below measurable limits under both break and no-break conditions.

Environmental rail-to-rail and rail-to-earth leakage was not simulated in this test but would not likely appear as a ratio change in the signal rail amplitudes; instead it would appear as a change in absolute signal value. Therefore, two widely separated signal frequencies are preferably used. Changes in inductance manifest as a change in the ratio of the amplitudes and phase shift of the two test frequencies. The amplitude ratio between frequencies for no break was found to be 2.15, while the amplitude ratio between frequencies for a break was found to be 1.54. Likewise, the phase ratio between frequencies for no break was found to be 0.32, while the phase ratio between frequencies for a break was found to be 0.38. The phase ratio for 150 kHz between break and no break conditions was found to be 1.27, while the phase ratio for 50 kHz between break and no break conditions was found to be 1.5. Thus, it was found that there was a very clear response in the measurements achieved between the break and no break conditions.

Example 2

After the successful test of Example 1 above, an embodiment of the present invention was constructed and tested on live track test sections that were up to two miles long. Rail break and train presence detection was tested and found to work as described. The described method for compensating for environmental effects was also tested and found to perform well. For this test, the following equipment was used: a PicoScope digital oscilloscope, a 15 watt ("W") linear audio power amplifier, three 1.5-ohm power resistors; a portable generator (for field power), clip leads, a FLUKE® (a registered trademark of Fluke Corporation) model 77 multimeter, a Brunelle 3200 LC meter, and a signal generator. The response of signal amplitude and phase to train presence and simulated rail break, shunt removal in this case, was consistent with expectations.

The test setup was connected as schematically illustrated in FIG. 1A. For the test, the resistor had a value of 5.2 ohms. Point 32 of the schematic of FIG. 1A was connected to channel A of the oscilloscope, while point 30 was connected to channel B of the oscilloscope. The signal generator included a 15-watt amplifier being driven from a signal generator. The 5.2 ohm series resistors used were rated at 50 W. The 15 W linear amplifier was used to drive the rail. Shunt 1 was in place at mile 96.5, while the test site was at mile 97.0. This shunt was a permanent shunt associated with existing crossing detection equipment.

Because it was impractical to intentionally create a break in an active section of track, we instead removed one of the shunts to simulate a break. Table 4 shows the results of tests when the break was simulated. The following values were measured/determined:

1) Initial DCR=~0.2 ohm
2) Shunt 2 was placed at mile 97.5.
3) Inductance was 12.6 mH
4) DCR=~0.2 ohm
5) Difference with shunt in and shunt out. Voltage differential was calculated as:

$$dVi = VA - VB \text{ for shunt in}$$
$$dVo = VA - VB \text{ for shunt out}$$
$$dPhase = \text{Phase Delay In} - \text{Phase Delay Out}$$
$$dV == dVi - dVo$$

Table 3 shows the results of tests when both shunts were in place while Table 4 shows the results of tests when shunt 2 was removed to simulate a broken rail. Table 5 shows the results of the comparison of the unbroken track segment and the simulated broken segment.

TABLE 3

| Frequency (Hz) | Voltage at Test Point A (Vp-p) | Voltage at Test Point B (Vp-p) | Phase Delay at Test Point B (us) |
|---|---|---|---|
| 150 | 19.30 | 6.11 | 371.8 |
| 300 | 19.57 | 6.52 | 304.5 |
| 1000 | 19.69 | 10.72 | 66.2 |
| 4000 | 19.69 | 13.40 | 8.6 |
| 10000 | 19.66 | 14.81 | 2.6 |

TABLE 4

| Frequency (Hz) | Voltage at Test Point A (Vp-p) | Voltage at Test Point B (Vp-p) | Phase Delay at Test Point B (us) |
|---|---|---|---|
| 150 | 19.37 | 7.05 | 330.8 |
| 300 | 19.56 | 7.41 | 262.9 |
| 1000 | 19.53 | 10.41 | 46.9 |
| 4000 | 19.48 | 13.30 | 9.1 |
| 10000 | 19.46 | 15.04 | 2.3 |

TABLE 5

| Frequency (Hz) | dVi (V) | dVo (V) | dV (V) | dPhase (us) |
|---|---|---|---|---|
| 150 | 13.19 | 12.32 | 0.87 | 41.0 |
| 300 | 13.05 | 12.15 | 0.90 | 41.6 |
| 1000 | 8.97 | 9.12 | −0.15 | 19.3 |
| 4000 | 6.29 | 6.18 | 0.11 | −0.5 |
| 10000 | 4.85 | 4.42 | 0.43 | 0.3 |

During the test, a clearly measurable difference in voltage and/or phase was noted at most frequencies—thus indicating that the concept of the invention is valid. Tests were also done with shunt 2 placed at about mile 98.5, thus creating a span of two miles between shunt 1 and shunt 2. A difference was noted at each of 1000 Hz and 300 Hz but there was not time to capture the detailed data due to an oncoming train. Train presence showed the expected opposite trends in voltage and phase at 300 Hz, with a clear downward trend as the train approached the test location and an increasing trend as it left the test location. The tests clearly indicated the ability to detect both rail break and train presence conditions.

The preceding example can be repeated with similar success by substituting the generically or specifically described components and/or operating conditions of embodiments of the present invention for those used in the preceding examples.

Optionally, embodiments of the present invention can include a general or specific purpose computer or distributed system programmed with computer software implementing steps described above, which computer software may be in any appropriate computer language, including but not limited to C++, FORTRAN, BASIC, Java, Python, Linux, assembly language, microcode, distributed programming languages, etc. All computer software can be embodied on any non-transitory computer-readable medium (including combinations of mediums), including without limitation CD-ROMs, DVD-ROMs, hard drives (local or network storage device), USB keys, other removable drives, ROM, and firmware.

The apparatus may also include a plurality of such computers/distributed systems (e.g., connected over the Internet and/or one or more intranets) in a variety of hardware implementations. For example, data processing can be performed by an appropriately programmed microprocessor, computing cloud, Application Specific Integrated Circuit (ASIC), Field Programmable Gate Array (FPGA), or the like, in conjunction with appropriate memory, network, and bus elements. One or more processors and/or microcontrollers can operate via instructions of the computer code and the software is preferably stored on one or more tangible non-transitive memory-storage devices.

Note that in the specification and claims, "about" or "approximately" means within twenty percent (20%) of the amount or value given.

Embodiments of the present invention can include every combination of features that are disclosed herein independently from each other. Although the invention has been described in detail with particular reference to the disclosed embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference. Unless specifically stated as being "essential" above, none of the various components or the interrelationship thereof are essential to the operation of the invention. Rather, desirable results can be achieved by substituting various components and/or reconfiguring their relationships with one another.

What is claimed is:

1. A detector comprising:
a circuit configured to apply at least two frequencies of alternating electrical current to a shunted segment of a track;
said circuit configured to measure an amplitude change and a phase angle change of the at least two frequencies of alternating electrical current and identify a break in at least a portion of the track based on the measured amplitude change and the phase angle change for each of the at least two frequencies; and
said circuit configured to measure an amplitude and phase of each of the at least two frequencies of alternating electrical current to cancel out common parasitic resistance that is in parallel with rail inductance of the shunted segment of the track normalizing the amplitudes of the at least two frequencies if the amplitudes of the at least two frequencies are not equal.

2. The detector of claim 1 wherein the track comprises a rail track.

3. The detector of claim 1 wherein the shunted segment of the track comprises an electrical shunt disposed at opposing ends of the shunted segment of the track.

4. The detector of claim 3 wherein said electrical shunt comprises an electrical conductor electrically connected between two rails of the shunted segment of the track.

5. The detector of claim 1 wherein said circuit is electrically connected at or about a midpoint of the shunted segment of the track.

6. The detector of claim 1 wherein said circuit is configured to monitor current flow to the shunted segment of the track.

7. The detector of claim 1 further comprising a communications unit.

8. The detector of claim 7 wherein said communications unit is configured to provide data telemetry.

9. The detector of claim 8 wherein said communications unit comprises a radio frequency transmitter.

10. The detector of claim 1 configured to transmit data and to relay data received from another detector.

11. The detector of claim 1 further comprising a communication node configured to receive and transmit data.

12. The detector of claim 1 wherein said circuit does not determine a break in a portion of the track merely by identifying a drop in current flow through all or a portion of the shunted track segment.

13. A method for detecting a break in at least a portion of a track comprising:
forming a track segment by establishing or otherwise using an electrical shunt at each end of the track segment;
applying at least two frequencies of alternating electrical current to the track segment, such that each of the at least two frequencies of alternating electrical current flow through two loops within the track segment;
monitoring a phase angle of each of the at least two frequencies of alternating electrical current;
transmitting data indicative of a break in the track; and
canceling out parasitic resistance of a first loop of the two loops that is in parallel with rail inductance of the first loop and canceling out parasitic resistance of a second loop of the two loops that is in parallel with rail inductance of the second loop by:
normalizing amplitudes of the two frequencies if the amplitudes of the two frequencies are not equal; and
monitoring a voltage and a phase of the at least two frequencies of alternating electrical current and using data from the monitored voltage and phase to cancel out the parasitic resistance of at the first loop and the second loop.

14. The method of claim 13 wherein establishing or otherwise using an electrical shunt at each end of the track comprises selecting a portion of track which is bounded by at least one existing electrical shunt.

15. The method of claim 13 wherein the track comprises a rail track.

16. The method of claim 13 wherein indicia of a break is generated in response to an observed positive amplitude shift from a baseline reference point for a lower of the at least two frequencies of alternating electrical current in addition to a negative phase shift being observed in a higher of the at least two frequencies of alternating current.

17. The method of claim 13 wherein the method determines a break in a portion of the track based on an electrical parameter other than reduced current flow.

18. The method of claim 13 wherein transmitting data indicative of a break comprises transmitting an alert of a break.

19. The method of claim 13 wherein transmitting data indicative of a break comprises transmitting data of or relating to the phase angle between the at least two frequencies such that a determination of a break can be made.

20. The method of claim 13 wherein transmitting data indicative of a break comprises transmitting data via a radio frequency of less than 200 kilohertz.

21. The method of claim 13 further comprising relaying data received from an apparatus that is configured to monitor a different track segment.

22. The method of claim 13 further comprising providing a communication node which is configured to receive data from a plurality of monitoring devices.

23. The method of claim 13 further comprising transmitting data indicative of a presence of a rail vehicle on the track segment.

24. The method of claim 13 wherein the rail vehicle is a train or a portion thereof and the track is a rail track.

* * * * *